United States Patent [19]
Yamaji et al.

[11] Patent Number: 5,311,086
[45] Date of Patent: May 10, 1994

[54] MULTIPLYING CIRCUIT WITH IMPROVED LINEARITY AND REDUCED LEAKAGE

[75] Inventors: Takafumi Yamaji, Yokohama; Chikau Yakahashi; Hiroshi Tanimoto, both of Kawasaki, all of Japan

[73] Assignee: Kabushiki Kaisha Toshiba, Kawasaki, Japan

[21] Appl. No.: 843,548

[22] Filed: Feb. 28, 1992

[30] Foreign Application Priority Data

Mar. 1, 1991 [JP] Japan .................. 3-059573

[51] Int. Cl.⁵ .............................................. H03K 5/22
[52] U.S. Cl. ................................ 307/498; 307/490; 307/491; 307/494; 307/529; 328/160
[58] Field of Search .............. 307/254, 355, 356, 362, 307/364, 490, 491, 493, 494, 498, 255, 496, 529; 328/160, 154

[56] References Cited

U.S. PATENT DOCUMENTS

| | | | |
|---|---|---|---|
| 3,689,752 | 9/1972 | Gilbert | 235/194 |
| 3,956,643 | 5/1976 | Hite | 307/498 |
| 4,359,647 | 11/1982 | Trinkl | 307/238.1 |
| 4,388,540 | 6/1983 | Schreurs | 307/493 |
| 4,636,663 | 1/1987 | Jongepier et al. | |
| 4,668,881 | 5/1987 | Piasecki | 307/355 |
| 4,686,674 | 8/1987 | Lam | 370/112 |
| 4,694,204 | 9/1987 | Nishijima et al. | 307/494 |
| 4,695,749 | 9/1987 | Lam | 307/455 |
| 4,814,642 | 3/1989 | Kleks | 307/350 |
| 4,823,028 | 4/1989 | Lloyd | 307/355 |
| 4,823,030 | 4/1989 | Wilhem et al. | 307/455 |
| 4,963,767 | 10/1990 | Sinh | 307/455 |
| 4,965,528 | 10/1990 | Okanobu | |
| 5,006,818 | 4/1991 | Koyama et al. | |
| 5,103,117 | 4/1992 | Voorman et al. | 307/355 |
| 5,115,409 | 5/1992 | Stepp | 364/841 |
| 5,144,174 | 9/1992 | Murakami | 307/494 |
| 5,170,079 | 12/1992 | Komatsu et al. | 307/355 |

OTHER PUBLICATIONS

Patent Abstracts of Japan, vol. 15, No. 078(E-1037), Feb. 22, 1991, & JP-A-22-96-408, Dec. 7, 1990, Funahashi Masahiro, "Differential Amplifier Circuit". Material for the Electronic Circuit Study Group, pp. 27-34, "Linear Transconducter Having Emitter-Coupled Pair, and the Application of the Transconducter", Dec. 18, 1990.
IEEE Journal of Solid-State Circuits, vol. 26, No. 7, Jul. 1991, pp. 937-945, H. Tanimoto, et al., "Realization of a 1-V Active Filter Using a Linearization Technique Employing Plurality of Emitter-Coupled Pairs".

*Primary Examiner*—Timothy P. Callahan
*Assistant Examiner*—Terry D. Cunningham
*Attorney, Agent, or Firm*—Oblon, Spivak, McClelland, Maier & Neustadt

[57] ABSTRACT

A multiplying circuit in which a pair of common-base transistors each having a small emitter area are inserted between the common emitter terminals of first and second differential amplifiers, which amplify a signal input to an input terminal pair and are connected in such a way as to cancel out their outputs which correspond to the input signal, and the output terminal pairs of multiple third differential amplifiers, which amplify a signal input to another input terminal pair and have a predetermined DC offset characteristic.

21 Claims, 16 Drawing Sheets

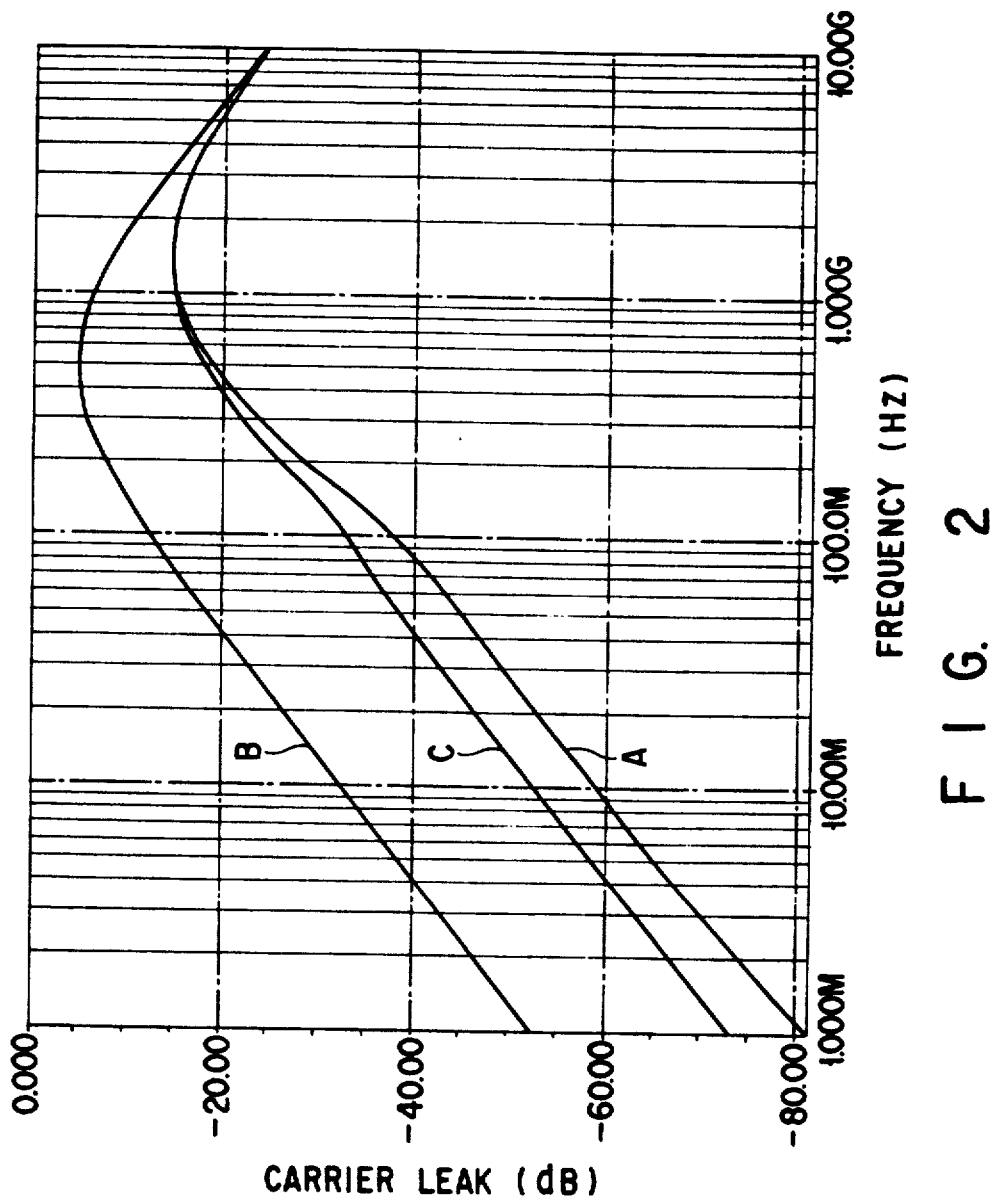
F I G. 2

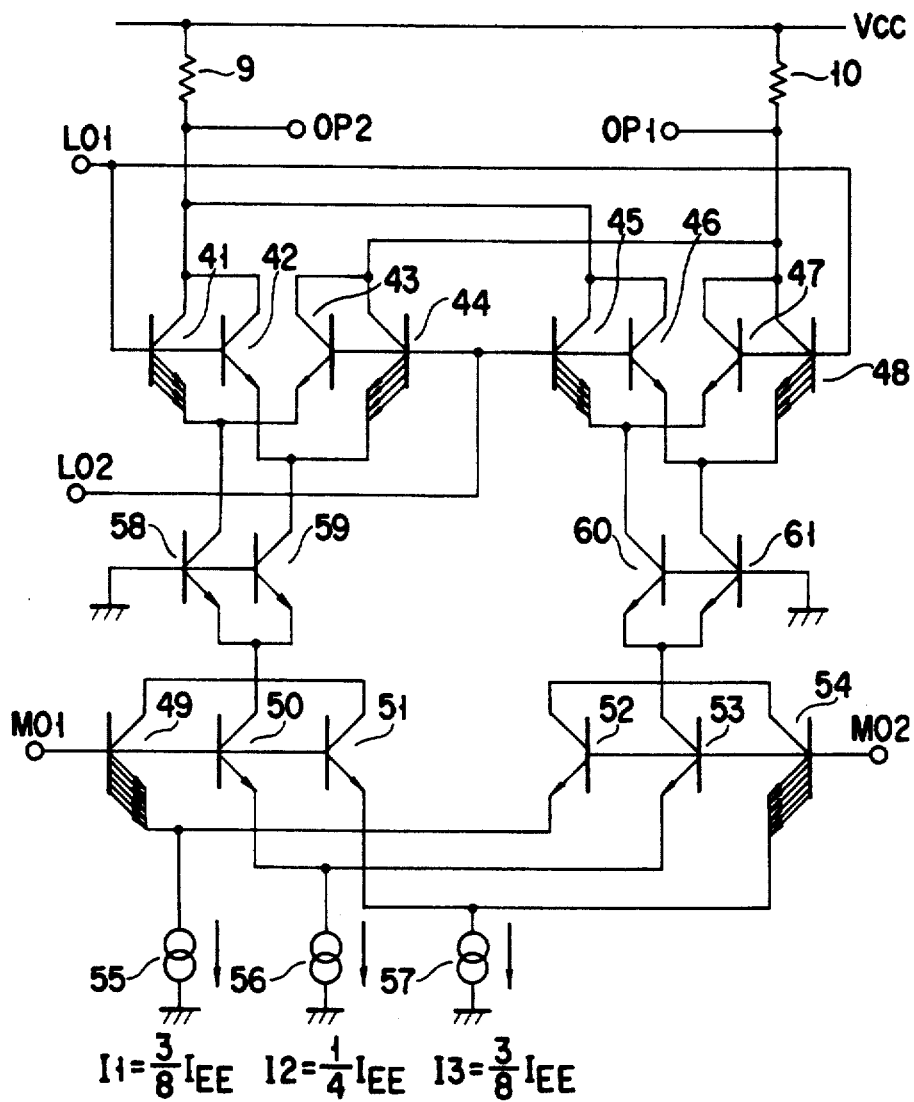
$I1 = \frac{3}{8}I_{EE}$  $I2 = \frac{1}{4}I_{EE}$  $I3 = \frac{3}{8}I_{EE}$
F I G. 5

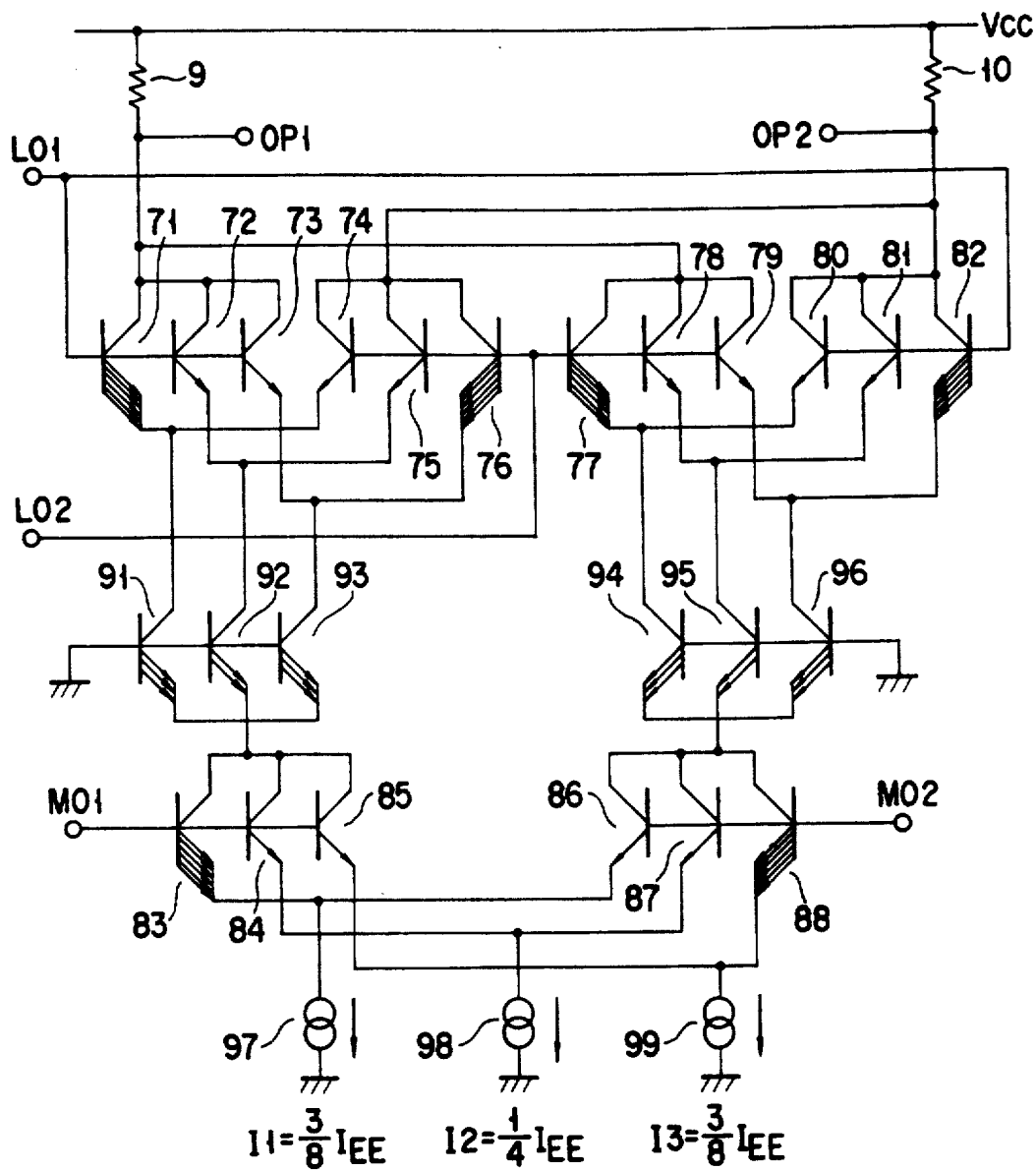
F I G. 6

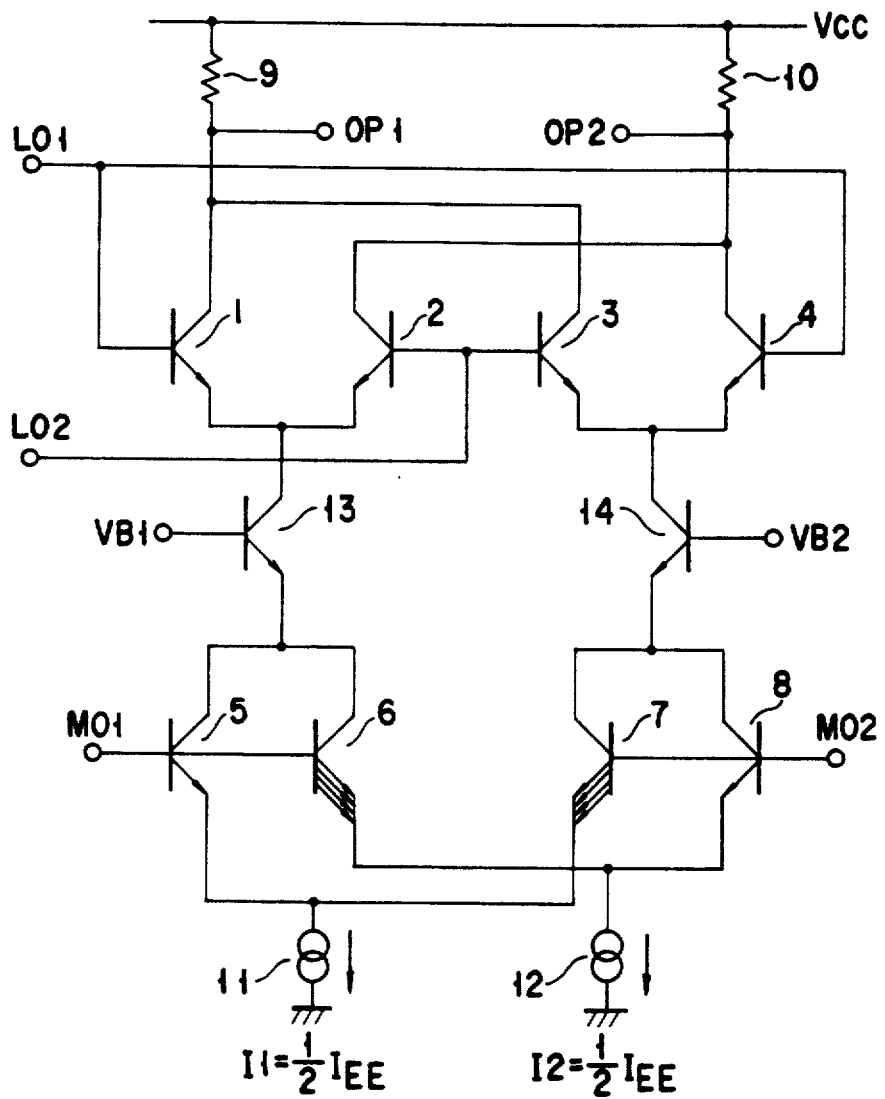
F I G. 8

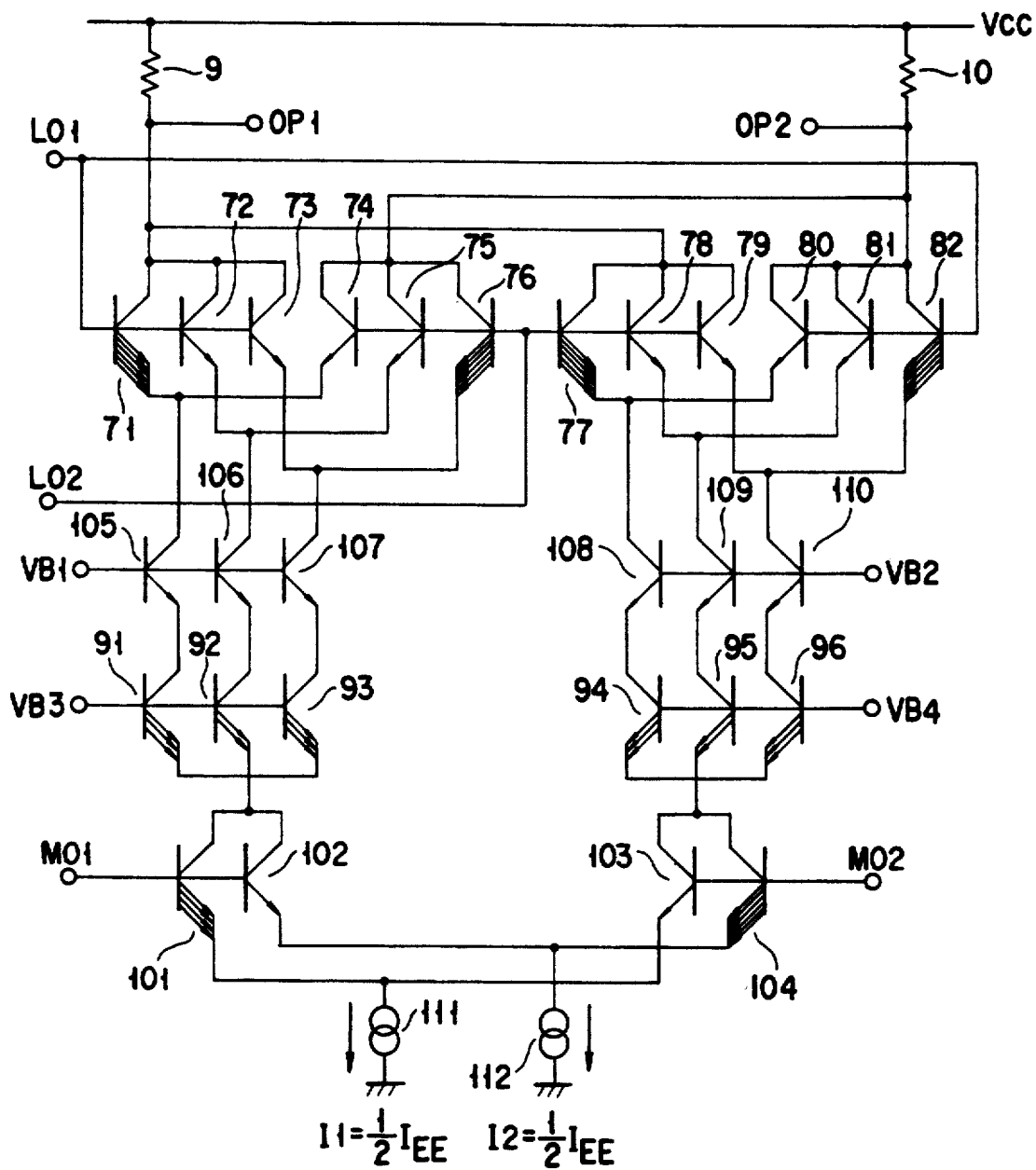
F I G. 12

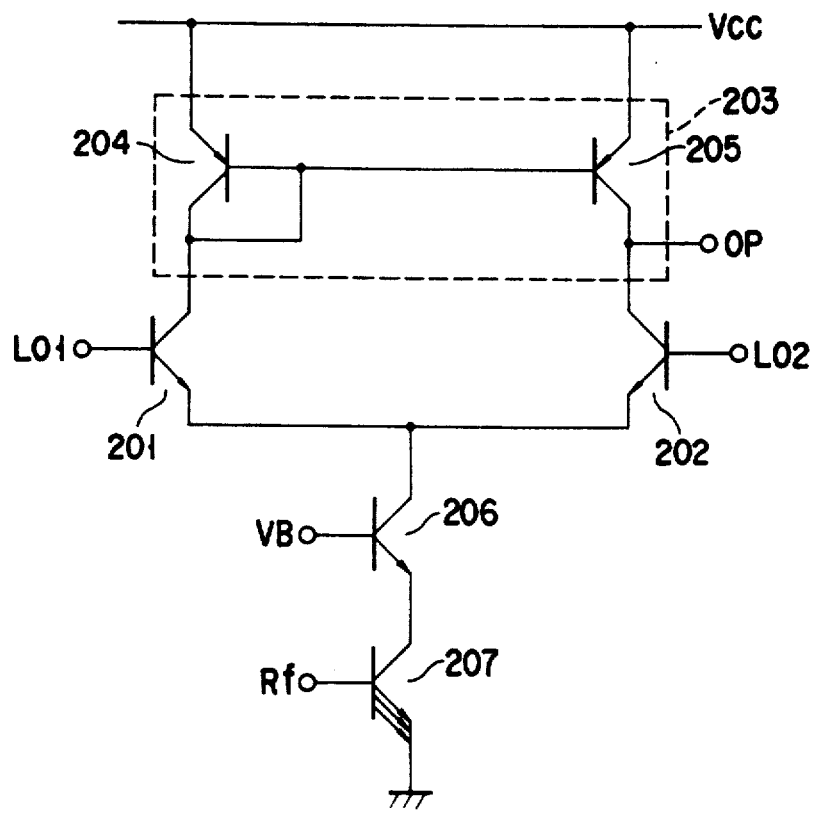
F I G. 13

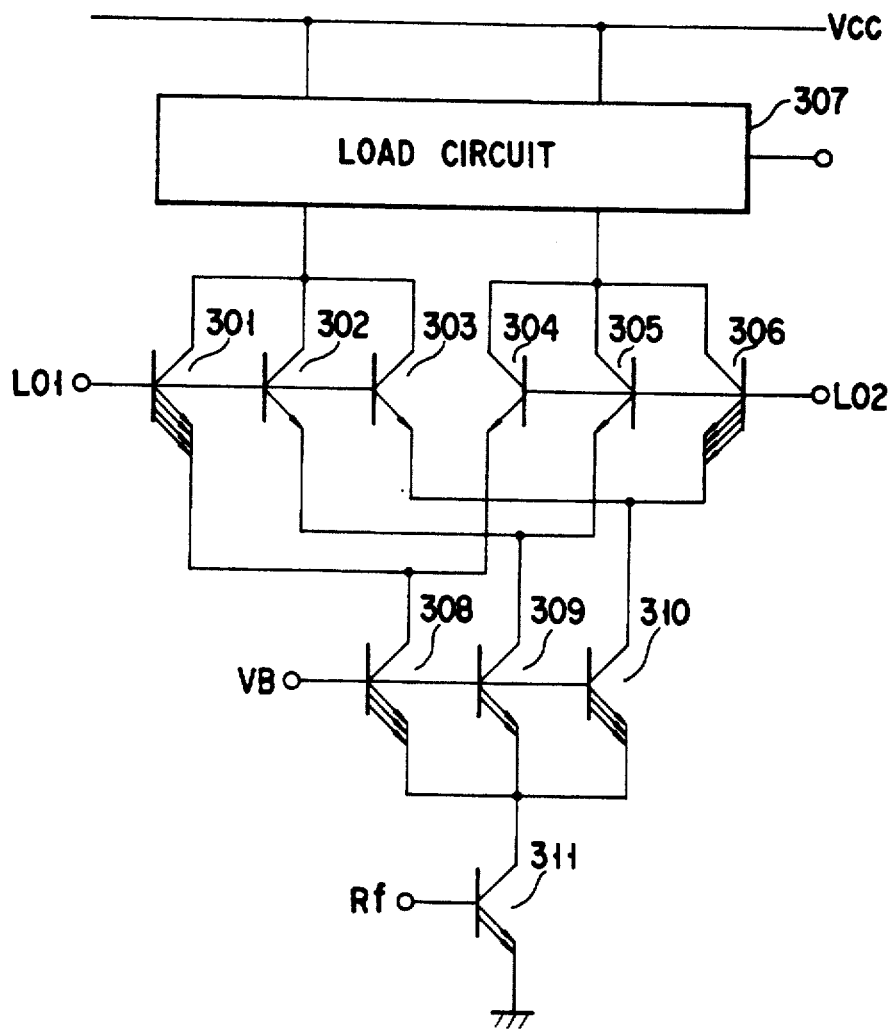
F I G. 14

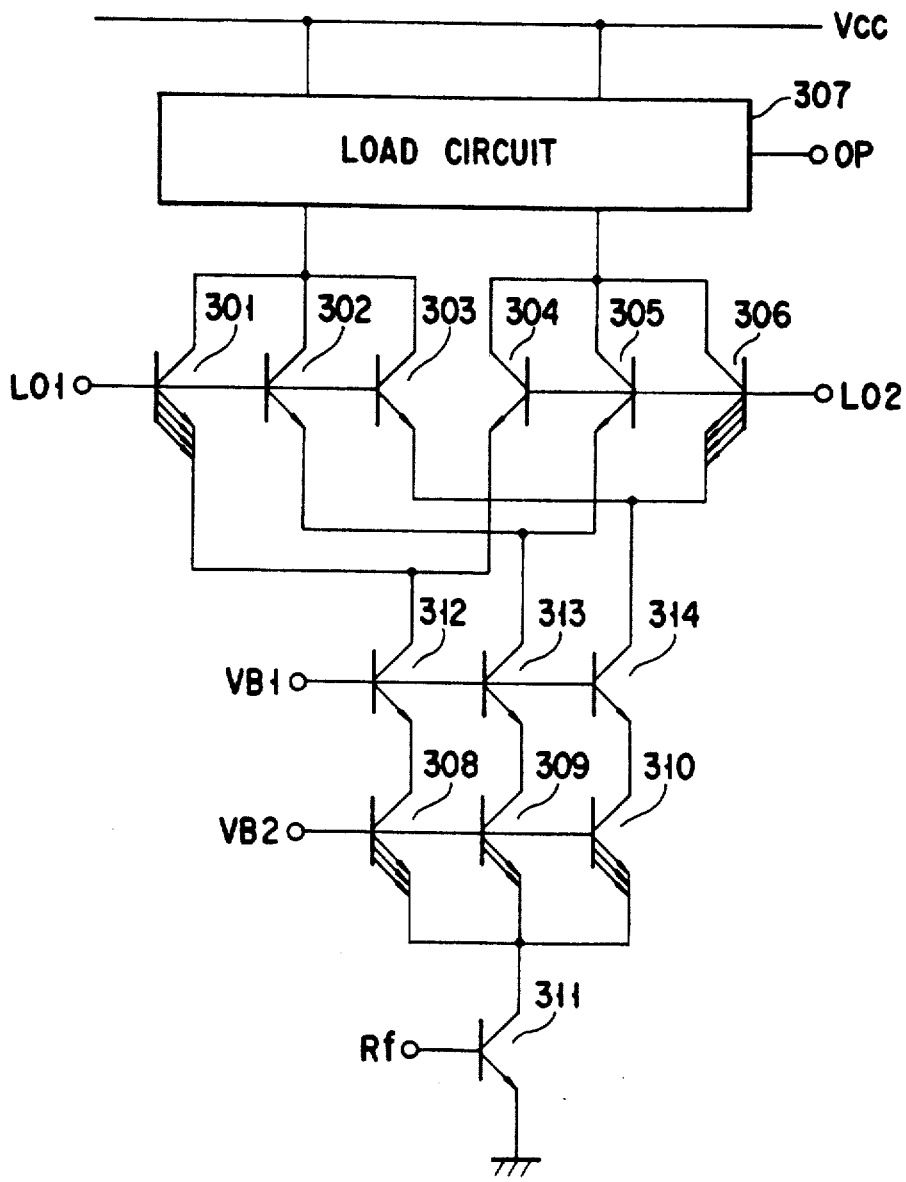
F I G. 15

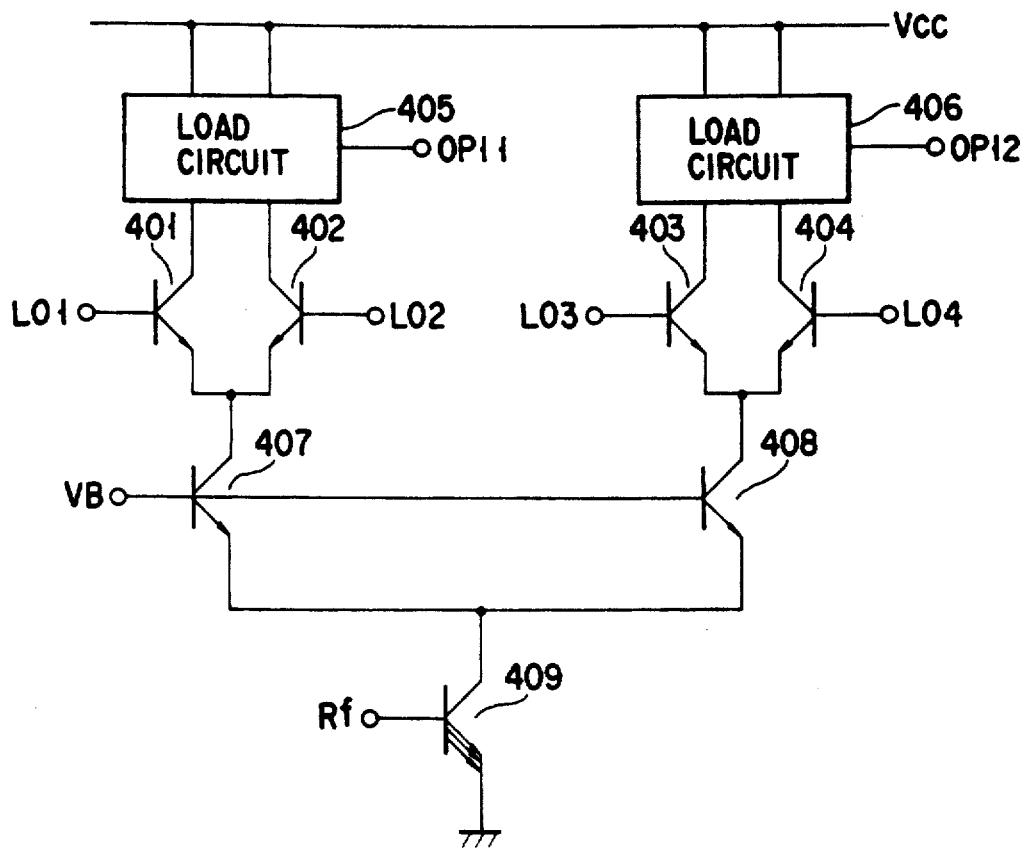
F I G. 16

MULTIPLYING CIRCUIT WITH IMPROVED LINEARITY AND REDUCED LEAKAGE

BACKGROUND OF THE INVENTION

1. Field of the Invention

The present invention relates to a multiplying circuit which comprises differential amplifiers and are adapted for use in a frequency converter, a synchronous detector, a quadrature modulator, a demodulator, a variable gain amplifier, etc.

2. Description of the Related Art

Conventional multiplying circuits have two pairs of input terminals respectively supplied with two input signals to be multiplied. The input signal input to one input terminal pair is amplified by a first differential amplifier and a second differential amplifier. The output terminal pairs of the first and second differential amplifiers are connected together in such a way that the outputs of those differential amplifiers with respect to the first input signal will cancel out each other. A second input signal input to the other input terminal pair is amplified by a third differential amplifier to be converted into a change in the collector current of transistors constituting this differential amplifier.

Since the first and second differential amplifiers have their common emitter terminal connected to the collector of the collectors of the transistors of the third differential amplifier, the gains of the first and second differential amplifiers are proportional to the collector current of the transistors of the third differential amplifier. Therefore, a voltage proportional to the product of voltages of the first and second input signals or a multiplied output is yielded between the common output terminal of the first and second differential amplifiers.

Such a multiplying circuit will have a deformed output signal waveform because of the non-linearity of the differential amplifiers as the voltage amplitudes of the input signals get large. As a solution to this shortcoming there has been proposed an art of constituting the third differential amplifier with a combination of two differential amplifiers and providing the proper DC offset to these differential amplifiers to widen the linearity range as disclosed in U.S. Pat. No. 4,965,528. The DC offset of the differential amplifier is determined by the emitter area of a pair of emitter coupled transistors constituting this differential amplifier.

Another multiplying circuit has also been proposed which combines three or more differential amplifiers to constitute the third differential amplifier in order to ensure a wider linearity range. How to set a given DC off to the differential amplifiers and weight a current to each differential amplifier in this case is disclosed in Electronic Circuit Study Report No. ECT-90-20 of Electric Committee and "Realization of a 1-V Active Filter Using a Linearization Technique Employing Plurality of Emitter-Coupled Pair", IEEE JOURNAL OF SOLID-STATE CIRCUITS, pages 937-944, VOL. 26, NO. 7, JULY 1991.

In this method, however, as the number of third differential amplifiers increases, their transistors should have a larger emitter area, increasing the parasitic capacitance of the transistors so that the use of the multiplying circuit at a high frequency becomes difficult. For instance, given that the emitter area ratio of one pair of emitter coupled transistors constituting the third differential amplifier is 1:4, the sum of the parasitic capacitances present between the collectors of the emitter coupled transistors and the ground becomes about five times greater than that of the previously described conventional multiplying circuit. As the frequency of the first input signal increases, therefore, the CMRR (Common Mode Rejection Ratio) of the first and second differential amplifiers falls. In addition, the frequency rise will increase signals that leak to the second input terminal pair from the first input terminal pair through the collector-base parasitic capacitance.

The drop of the CMRR causes a local oscillator signal to the transmission output side to increase in the where the multiplying circuit is used as a frequency converter or a modulator in a transmitter, for example, with a local oscillator signal and a transmission signal respectively given as the first and second input signals to the frequency converter or the modulator. With the multiplying circuit used as a frequency converter in a receiver, for example, when the number of signals leaking to the second input terminal pair from the first input terminal pair increases, the local oscillator signal input to the first input terminal pair will increase the undesirable radiation from an antenna via the second input terminal pair, a high frequency amplifier and the like.

The conventional ways of broadening the linearity range can apply only to the third differential amplifier side to which the second input signal is to be input, and cannot widen the linearity ranges of the first and second differential amplifiers. This undesirably causes the first input signal component to be easily deformed.

If the frequencies of the first and second input signals are relatively different from that of the desired output signal as in a frequency converter or a demodulator, a multiplying circuit comprising half of the circuit components of the first described conventional multiplying circuit is often used. That is, this multiplying circuit comprises a first differential amplifier connected to a first input terminal pair, and a common-emitter transistor connected to the common emitter of the transistors of the first differential amplifier The first and second input terminal pairs of this multiplying circuit are supplied with two input signals to be multiplied, the second input terminal pair connected to the base of the common-emitter transistor. The first input signal input to the first input terminal pair is amplified by the differential amplifier, while the second input signal input to the second input terminal pair is amplified by the common-emitter transistor. A multiplied output of the first and second input signals is acquired from an output terminal provided in a load circuit of the differential amplifier.

This multiplying circuit if used as a frequency converter or a demodulator in a receiver has a disadvantage of having an insufficient noise factor. The noise generated in the multiplying circuit is mainly thermal nose from the parasitic resistor of the base of the common-emitter transistor. The thermal noise can be reduced by setting the emitter area of the common-emitter transistor larger or increasing the base area.

Increasing the emitter area of the common-emitter transistor however would result in a decrease in the CMRR of the differential amplifier and an increase in the signals leaking from the first input terminal pair to the second input terminal pair, as in the first described conventional multiplying circuit which comprises three differential amplifiers to improve the linearity. In a direct conversion type receiver, particularly, the reception frequency is nearly equal to the local oscillator frequency, so that when a local oscillator signal is input to the first input terminal pair and a reception signal to the second input terminal pair, the local oscillator signal will leak through the second input terminal pair. This gives rise to a significant problem.

In short, the first described multiplying circuit designed to improve the linearity range has the following two disadvantages:

1) The CMRR of the differential amplifier decreases in a high frequency range (radio frequency band) due to an increase in the parasitic capacitance of transistors in use and the degree of one input signal leaking from one input terminal pair to the other input terminal pair increases.

2) Widening of the linearity range is accomplished for only one of two input signals, resulting in insufficient suppression of the deformation of the other input signal.

Further, the use of a common-emitter transistor having a large emitter area to improve the nose factor in the second described conventional multiplying circuit would also result in undesirable reduction of the CMRR of the differential amplifier in a high frequency range and increase in the degree of one input signal leaking from one input terminal pair to the other input terminal pair.

SUMMARY OF THE INVENTION

It is therefore an object of the present invention to provide a multiplying circuit which can prevent the reduction of the CMRR on the high frequency side due to the parasitic capacitance of a transistor and can suppress the degree of signal leakage from one input terminal pair to another input terminal pair.

It is another object of this invention to provide a multiplying circuit capable of widening the linearity range of a differential amplifier of both input terminals to thereby achieve lower signal deformation.

According to one aspect of the present invention, there is provided a multiplying circuit which basically has a common-base transistor inserted between an amplifier section for a first input signal and an amplifier section for a second input signal.

That is, a multiplying circuit designed for higher linearity has common-base transistors inserted respectively between a common emitter terminal of first and second differential amplifiers for amplifying a first input signal and output terminal pairs of multiple third differential amplifiers for amplifying a second input signal. More specifically, the multiplying circuit comprises first and second differential amplifiers, which receive a first input signal and each have an output terminal pair and a common emitter terminal; an output circuit for connecting the output terminal pairs of the first and second differential amplifiers in such a way as to cancel out outputs of the first and second differential amplifiers, which correspond to the first input signal, and providing a difference between the outputs of the first and second differential amplifiers as an output signal; first and second common-base transistors having bases grounded in AC mode and collectors connected to the common emitter terminals of the first and second differential amplifiers; and multiple third differential amplifiers each having an output terminal pair connected commonly to emitters of the first and second common-base transistors and each given with a predetermined DC offset.

The multiplying circuit may comprise a plurality of first and second differential amplifiers, in which case a plurality of first and second common-base transistors are provided. This design can provide a DC offset to the first and second differential amplifiers.

According to another aspect of the present invention, there is provided a multiplying circuit for amplifying a second input signal by means of a common-emitter transistor which has such a common-emitter transistor inserted between a common emitter terminal of a differential amplifier and the collector of the common-emitter transistor. More specifically, the multiplying circuit comprises a differential amplifier, which receives a first input signal and has an output terminal pair and a common emitter terminal; a load circuit connected to at least one output terminal of the output terminal pair of the differential amplifier; a common-emitter transistor having a base supplied with a second input signal; and a common-base transistor having a base grounded in an AC manner, a collector connected to the common emitter terminal of the differential amplifier, and an emitter connected to a collector of the common-emitter transistor and having a smaller emitter area than the common-emitter transistor.

When the first and second common-base transistors are inserted between the common emitter terminal of the first and second differential amplifiers and output terminal pairs of multiple third differential amplifiers, the emitter areas of these common-base transistors can be made smaller than the largest emitter area of transistors used in the third differential amplifiers. An impedance as viewed toward the output terminal pair side of the third differential amplifier from the common emitter terminal of the first and second differential amplifiers therefore becomes larger than the one yielded in a multiplying circuit without such common-base transistors.

Even if the emitter area of some transistor in the third differential amplifier increases and produces a DC offset to that transistor, it will still be possible to prevent the CMRR of the first and second differential amplifiers from falling due to the large parasitic capacitance of the transistor and reduce the degree of signal leakage from the first input terminal pair to the second input terminal pair.

Further, the provision of multiple first and second common-base transistors and multiple first and second differential amplifiers to impart a DC offset to the first and second differential amplifiers can widen not only the linearity of the first input signal but also the linearity to the second input signal, accomplishing lower signal deformation in the entire multiplying circuit.

With a common-base transistor inserted between the common emitter terminal of the differential amplifier for amplifying the first input signal and the collector of the common-emitter transistor for amplifying the second input signal, even when a transistor with a large area is used as the common-emitter transistor in order to reduce the parasitic resistance of the base, the CMRR of the differential amplifier is prevented from falling and the degree of signal leakage from the first input terminal pair to the second input terminal pair is suppressed because of the above-described principle. Although the parasitic resistance of the base of the common-base transistor is large, thermal noise originating from this parasitic resistance hardly appears on the output due to the negative feedback effect caused by the output impedance of the common-emitter transistor. The noise factor of the multiplying circuit can be improved while increasing the area of the common-emitter transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a diagram illustrating the frequency response of a carrier leak at the output terminal of the multiplying circuit shown in FIG. 1;

FIG. 5 is a circuit diagram of a multiplying circuit according to a third embodiment of the present invention;

FIG. 6 is a circuit diagram of a multiplying circuit according to a fourth embodiment of the present invention;

FIG. 8 is a circuit diagram showing a modification of the first embodiment;

FIG. 12 is a circuit diagram showing a modification of the fifth embodiment;

FIG. 13 is a circuit diagram of a multiplying circuit according to a sixth embodiment of the present invention;

FIG. 14 is a circuit diagram of a multiplying circuit according to a seventh embodiment of the present invention;

FIG. 15 is a circuit diagram of a multiplying circuit according to an eighth embodiment of the present invention; and FIG. 16 is a circuit diagram of a multiplying circuit according to a ninth embodiment of the present invention.

DETAILED DESCRIPTION OF THE PREFERRED EMBODIMENTS

Figure 1:
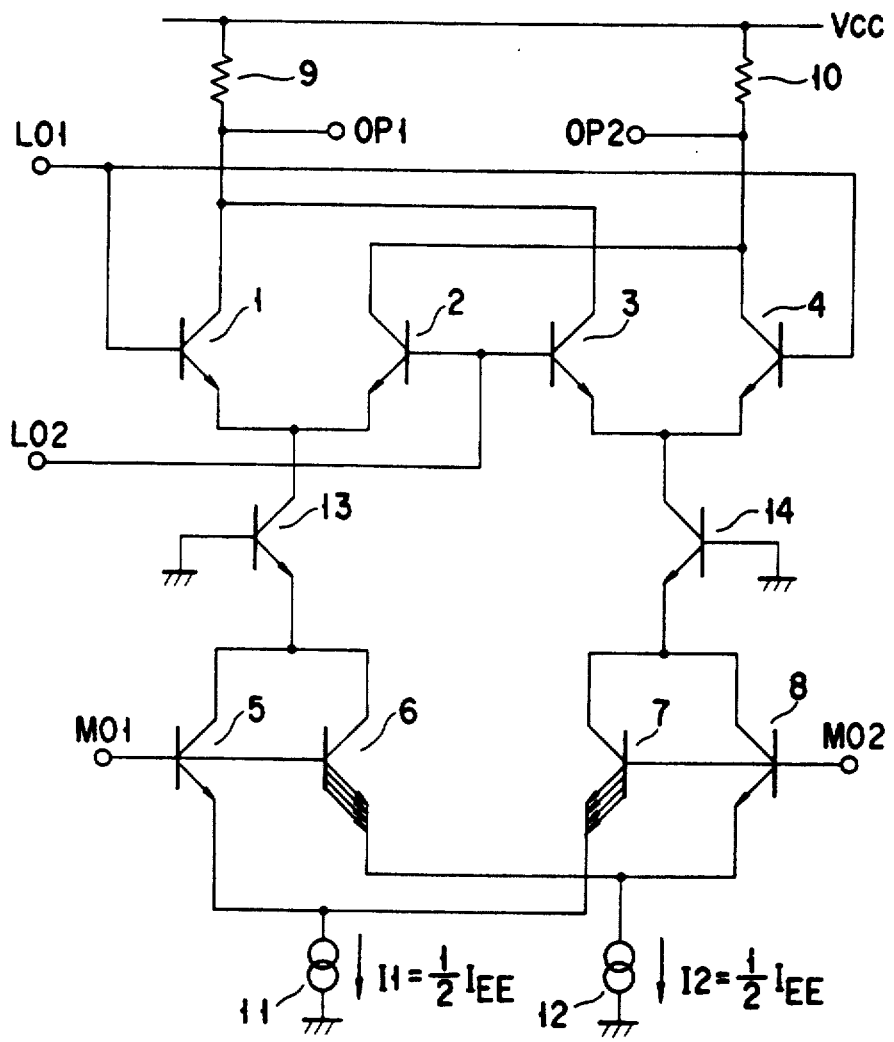
FIG. 1 is a circuit diagram of a multiplying circuit according to a first embodiment of the present invention.

In FIG. 1, two input signals to be multiplied are input to two pairs of input terminals, LO1 and LO2, and MO1 and MO2. The first input signal input to the input terminal pair LO1 and LO2 is amplified by a first differential amplifier comprising transistors 1 and 2, and a second differential amplifier comprising transistors 3 and 4. A pair of output terminals (collectors of the transistors 1 and 2) of the first differential amplifier are connected to a pair of output terminals (collectors of the transistors 3 and 4) of the second differential amplifier in such a way that the outputs of both differential amplifiers to the first input signal cancel out each other. The first and second differential amplifiers have their output terminal pairs connected to first ends of load resistors 9 and 10 as well as a pair of output terminals OP1 and OP2 of a multiplying circuit.

In the first differential amplifier, the transistor 1 with a base connected to the input terminal LO1 has the collector connected to the load resistor 9 and the output terminal OP1, and the transistor 2 with a base connected to the input terminal LO2 has the collector connected to the load resistor 10 and the output terminal OP2. In the second differential amplifier, however, the transistor 4 with a base connected to the input terminal LO1 has the collector connected to the load resistor 10 and the output terminal OP2, and the transistor 3 with a base connected to the input terminal LO2 has the collector connected to the load resistor 9 and the output terminal OP1. The other ends of the resistors 9 and 10 are connected to a voltage supply Vcc.

First and second common-base transistors 13 and 14 whose bases are grounded in an AC manner have their collectors respectively connected to a common emitter terminal of the transistors 1 and 2 of the first differential amplifier and that of the transistors 3 and of the second differential amplifier.

The second input signal input to the input terminal pair MO1 and MO2 is amplified by two third differential amplifiers respectively comprising transistors 5 and 7, and transistors 6 and 8. The common emitter terminals of the third differential amplifiers are connected to constant current sources 11 and 12.

Output terminal pairs of the third differential amplifiers are connected in common to the emitters of the common-base transistors 13 and 14. That is, the collectors of the transistors 5 and 6 are commonly connected to the emitter of the first common-base transistor 13, and the collectors of the transistors 7 and 8 are commonly connected to the emitter of the second common-base transistor 14.

The two transistors constituting each third differential amplifier have a predetermined emitter area ratio. In this embodiment, the emitter area ratio of the transistor 6 to the transistor 7 is about four times greater than that of the transistor 5 to the transistor 8. Such setting of the emitter area ratios will give a DC offset to the two third differential amplifiers with respect to the second input signal from the input terminal pair MO1 and MO2. Synthesizing the outputs of the differential amplifiers therefore widens the linearity range of the third differential amplifiers. The principle of expanding the linearity range by the DC offset is well known, and its detailed explanation will not therefore be given.

The first and second differential amplifiers which amplify the first input signal have their common emitter terminals linked to the pair of the output terminals of the third differential amplifiers through the common-base transistors 13 and 14, respectively. The gains of the first and second differential amplifiers are therefore proportional to the collector current in the third differential amplifiers which amplify the second input signal. Between the output terminals OP1 and OP2 is obtained an output signal whose voltage amplitude is proportional to the product of the first and second input signals. The circuit shown in FIG. 1 therefore serves as a multiplying circuit.

The common-base transistors 13 and 14 have an emitter area smaller than the maximum emitter area of the transistors (emitter area of the transistors 6 and 7) in the third differential amplifiers, and also has a smaller parasitic capacitance. If the emitter area of the common-base transistors 13 and 14 is the same as that of the transistors 5 and 8 in the third differential amplifiers, and the emitter area of the transistors 6 and 7 is about five times that of the transistors 5 and 8, the parasitic capacitance of the transistors 13 and 14 becomes approximately 1/5. In a high frequency range, therefore, an impedance as viewed from the common emitter terminals of the first and second differential amplifiers toward the third differential amplifiers is high, compared with the conventional case where the common-base transistors 13 and 14 are not provided and the linearity range of the third differential amplifiers is widened by connecting the collectors thereof directly to the common emitter terminals of the first and second differential amplifiers. The CMRR (Common Mode Rejection Ratio) of the first and second differential amplifiers rises at a high frequency accordingly.

FIG. 2 illustrates effects of the CMRR confirmed by computer simulation. Generally, a multiplying circuit of this type has one of the input terminals of a differential amplifier grounded in AC mode. In the multiplying circuit in FIG. 1, therefore, a sine wave is input to the input terminal LO1, thereby yielding the frequency response of a carrier leak at the output terminal OP1 when the input terminal LO2 is grounded in an AC manner. FIG. 2 shows the frequency response. In FIG. 2, curve A shows the carrier leak of the multiplying circuit in FIG. 1, curve B presents the carrier leak of the multiplying circuit excluding the common-base transistors 13 and 14 in FIG. 1, and curve C shows the carrier leak of the conventional basic multiplying circuit.

When a signal only consisting of difference components is input between the input terminal pair LO1 and LO2, the carrier leak is −100 dB or below. The curves in FIG. 2 therefore show the carrier leaks for a common mode. As shown by the curve A, the multiplying circuit i FIG. 1 has lower carrier leak in the all frequency ranges than the multiplying circuit without the common-base transistors 13 and 14. Particularly in a low frequency range, the carrier leak of the multiplying circuit in FIG. 1 is reduced by about 30 dB, and is about 8 dB less than that of the conventional multiplying circuit. According to the present invention, the improvement on the CMRR is apparent.

In a case where the multiplying circuit is used as the frequency converter or modulator of a transmitter, and a local oscillator signal and a transmission signal are input respectively as the first and second input signals, a carrier leak to a transmission output side can be decreased.

Further, since the changes of collector voltages in the common base transistors 13 and 14 are transmitted less to their emitters, the transistors 5 and 6 have a smaller change in their collector voltages. Accordingly, the carrier leak from the input terminal Lo1 to the input terminal MO1 is reduced.

As a result, if the multiplying circuit, when used as the frequency converter of a receiver, receives a local oscillator signal from a local oscillator between the input terminals LO1 and LO2, and a reception signal between the input terminals MO1 and MO2, it is possible to decrease the amount of the local oscillator signal that leaks from input terminals MO1 and MO2 and leaves as undesirable radiation from an antenna via a high frequency amplifier, etc.

Figure 3:
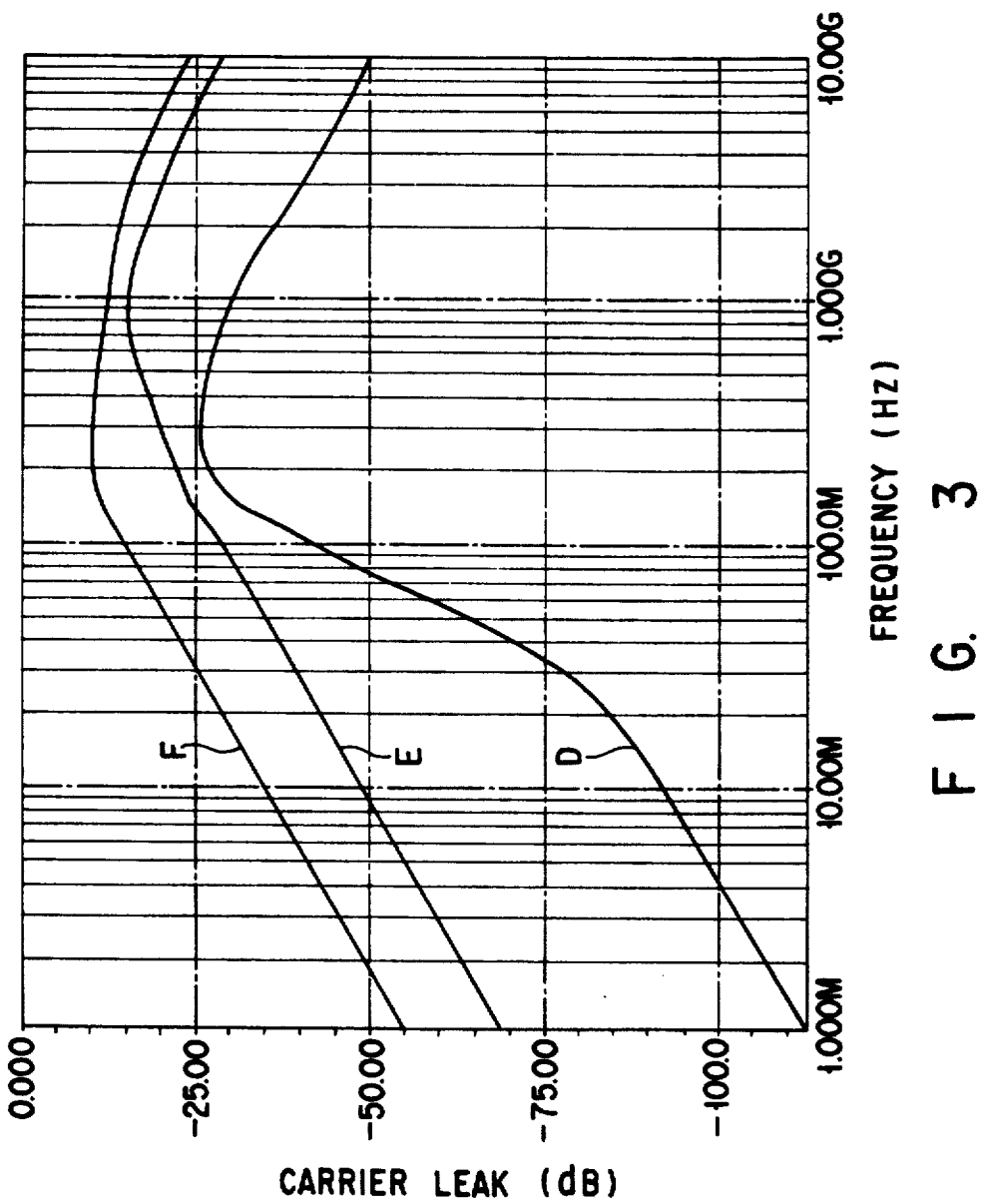
FIG. 3 is a diagram illustrating the frequency response of a carrier leak at the input terminal of the multiplying circuit shown in FIG. 1.

FIG. 3 illustrates the results of the reduction in the carrier leak confirmed by computer simulation, and shows the frequency response of the carrier leak to the input terminal MO1 with the same input as in the case of FIG. 2 applied between the input terminal pair LO1 and LO2. In FIG. 3, a curve D shows the carrier leak of the multiplying circuit in FIG. 1, a curve E the carrier leak of the multiplying circuit excluding the common-base transistors 13 and 14 in FIG. 1, a curve F the carrier leak of the conventional basic multiplying circuit. The curve D shows the lower carrier leak in all frequency ranges than the curves E and F. Particularly, in a low frequency range, the carrier leak of the multiplying circuit in FIG. 1 is 40 dB less than that of the basic multiplying circuit. The decrease in the carrier leak according to the present invention is apparent.

Figure 4:
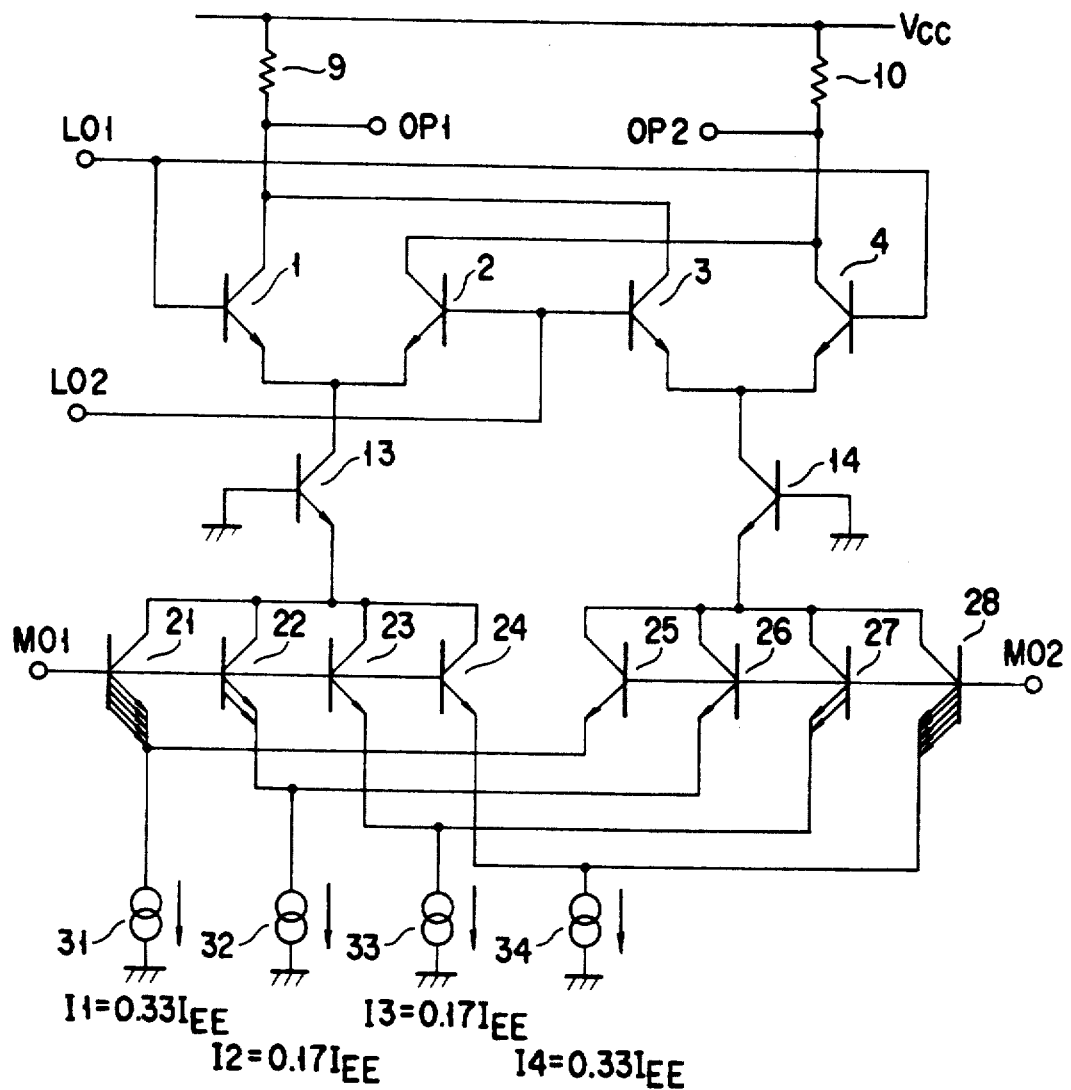
FIG. 4 is a circuit diagram of a multiplying circuit according to a second embodiment of the present invention.

Another embodiment of the present invention will now be described. FIG. 4 illustrates a multiplying circuit according to the second embodiment, which ensures a larger linearity range by the combination of four third differential amplifiers. The four third differential amplifiers comprise pairs of differential transistors 21 and 25, 22 and 26, 23 and 27, and 24 and 28, and constant current sources 31 to 34, respectively. The constant current sources 31–34 are connected to the corresponding common emitter terminals of the transistor pairs. If the emitter area ratio of the transistors 21 and 28, to the 22 and 27, and to the transistors 23–26 is determined to be 13:2:1, for example, a DC offset is given to the individual differential amplifiers. In other words, four pairs of transistors 21, 25; 22, 26; 23, 27; and 24, 28 have emitter area ratios of 13:1; 2:1; 1:2; and 1:13, respectively. The currents of the constant current sources 31 to 34 are weighted by determining the current ratio of the constant current sources 31 to 34 as shown in FIG. 4.

The number of the differential amplifiers may be three or five or greater, and has only to be selected in accordance with the required linearity range. As the number of the differential amplifiers is increased, transistors with a larger emitter area are needed as apparent from the example shown in FIG. 4, increasing the parasitic capacitance accordingly, so that the improvement on the frequency response by the provision of the common-base transistors 13 and 14 becomes more prominent.

FIG. 5 illustrates a multiplying circuit according to the third embodiment in which there are two first differential amplifiers and two second differential amplifiers, with the same number of first and second common-base transistors. More specifically, the first differential amplifier comprises a differential transistor pair 41 and 43 and a differential transistor pair 42 and 44, and the second differential amplifier comprises a differential transistor pair 45 and 47 and a differential transistor pair 46 and 48. By determining the emitter area ratio of the transistors 41, 44, 45 and 48 to the transistors 42, 43, 46 and 47 to 4:1, for example, a DC offset is given to the first and second differential amplifiers. In other words, two pairs of transistors 41, 43; and 42, 44 have emitter area ratios of 4:1; and 1:4, respectively. Similarly, two pairs of transistors 45, 47; and 46, 48 have emitter area ratios of 4:1; and 1:4, respectively.

Two common emitter terminals of the first differential amplifier are connected to the collectors of the first common-base transistors 58 and 59, while two common emitter terminals of the second differential amplifier are connected to the collectors of the second common-base transistors 60 and 61. Three third differential amplifiers are constituted by transistors 49 to 54, and constant current sources 55 to 57, respectively. One terminal of the common output terminal pair of those third differential amplifiers (the common collector terminal of the transistors 49 to 51) is connected in common to the emitters of the first common-base transistors 58 and 59. The other terminal of this common output terminal pair (the common collector terminal of the transistors 52 to 54) is connected in common to the emitters of the second common-base transistors 60 and 61.

According to this embodiment, a DC offset can be given to the first and second differential amplifiers by the provision of multiple first and second common-base transistors and provision of multiple first and second differential amplifiers, so that the linearity also to the first input signal to be applied to the input terminal pair LO1 and LO2 can be widened. The multiplying circuit according to this embodiment is therefore suitable for a use in which both input signals are information signals and linearity to both inputs is required over a wide frequency range.

FIG. 6 shows a multiplying circuit according to the fourth embodiment which are provided with three first and second differential amplifiers constituted by transistors 71 to 82 and three third and fourth common-base transistors 91-93 and 94-96. The third differential amplifiers comprise transistors 83 to 88 and constant current sources 97 to 99.

In this embodiment, the emitter area ratio of the transistors 71, 76, 77 and 82 to the transistors 72-75 and 78-81 in the first and second differential amplifiers is determined to be 8:1, and the emitter area ratio of the common-base transistors 91, 93, 94 and 96 to the transistors 92 and 95 is determined to be 3:2, for example, a DC offset is given to the first and second differential amplifiers, and a collector current proportional to the emitter area will flow through the common base transistors. It is therefore possible to weight the distribution ratio of the emitter currents to the first and second differential amplifiers.

In the third differential amplifiers, as the emitter area ratio of the transistors 83 and 88 to the transistors 84–87 is determined to be 8:1, for example, and the current ratio of the constant current sources 97 to 99 is set as given in FIG. 6, a DC offset is given to the individual differential amplifiers and the current weighting is performed.

The use of the weighting system in this embodiment can permit the whole multiplying circuit to be constituted by either npn type transistors or pnp type transistors. In general, npn transistors have a better frequency response than pnp transistors in an integrated circuit. The feature of this embodiment to allow a multiplying circuit to be constituted by npn transistors alone is advantageous to improve the frequency response of the multiplying circuit.

Figure 7:
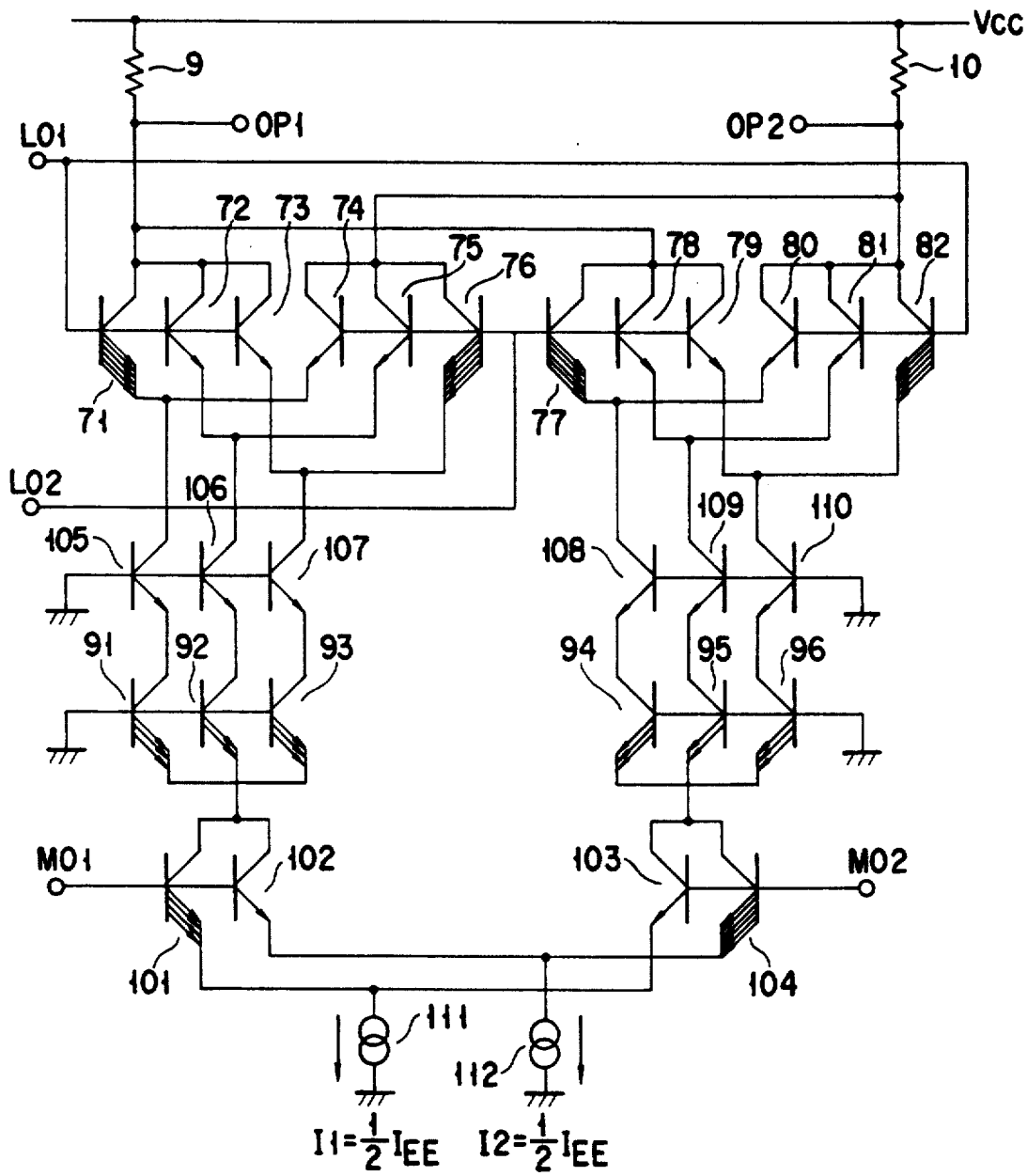
FIG. 7 is a circuit diagram of a multiplying circuit according to a fifth embodiment of the present invention.
Figure 9:
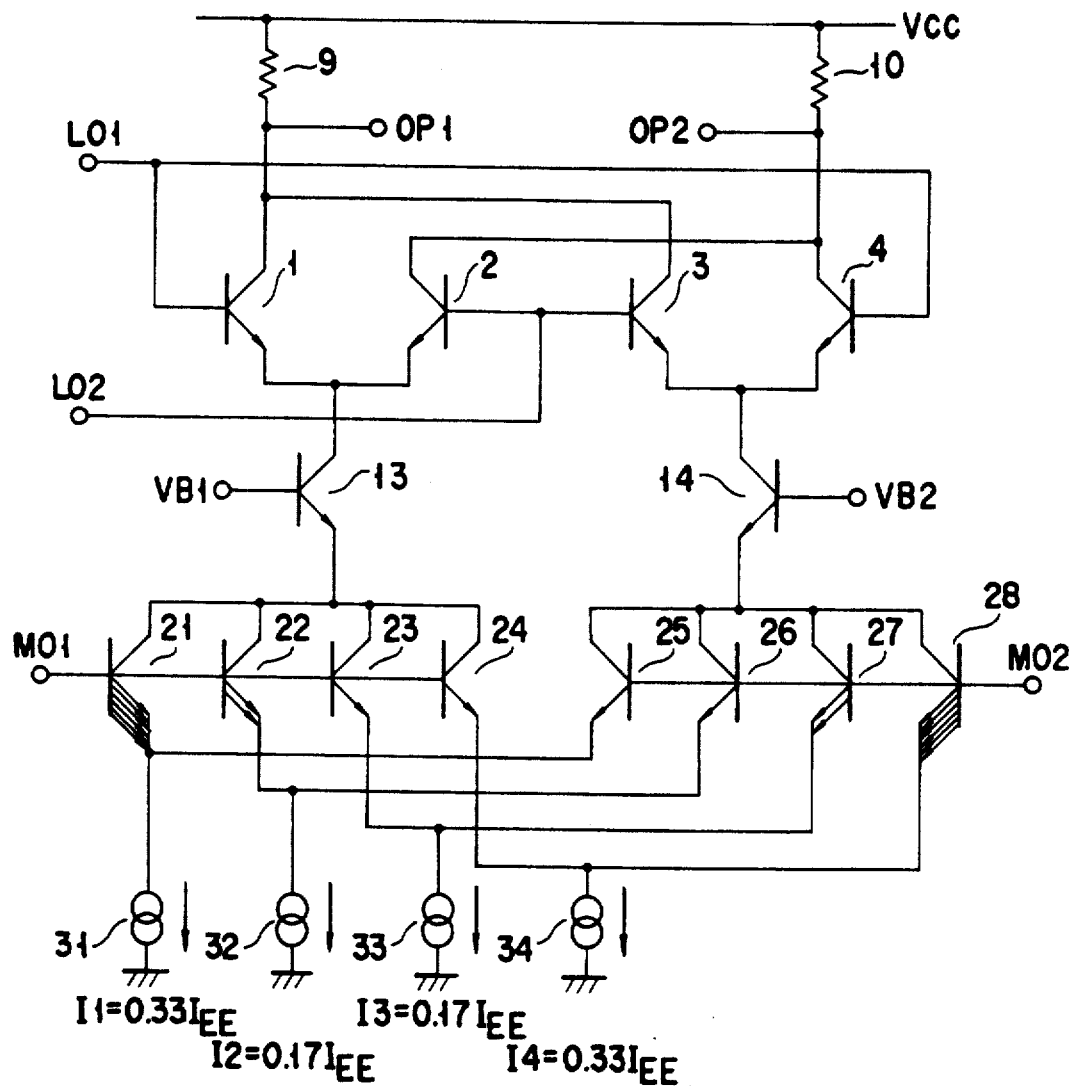
FIG. 9 is a circuit diagram showing a modification of the second embodiment.
Figure 10:
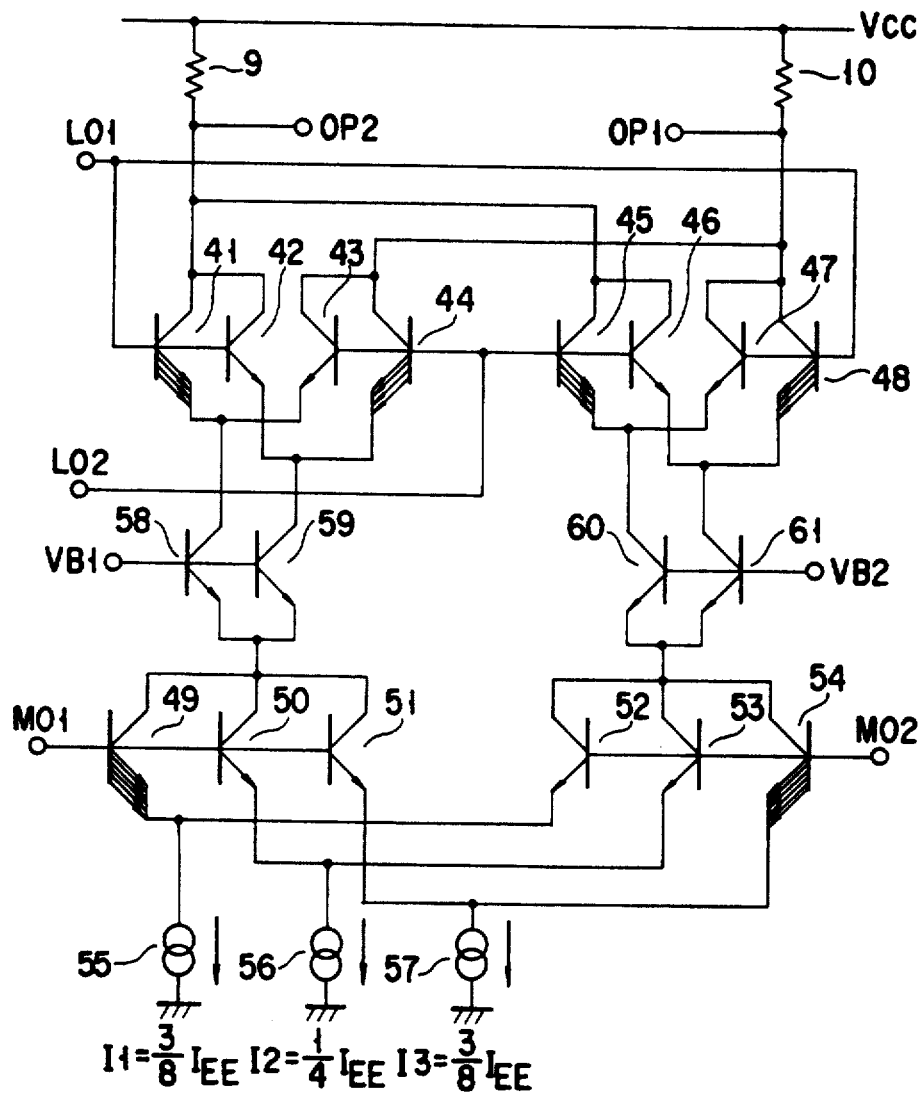
FIG. 10 is a circuit diagram showing a modification of the third embodiment.
Figure 11:
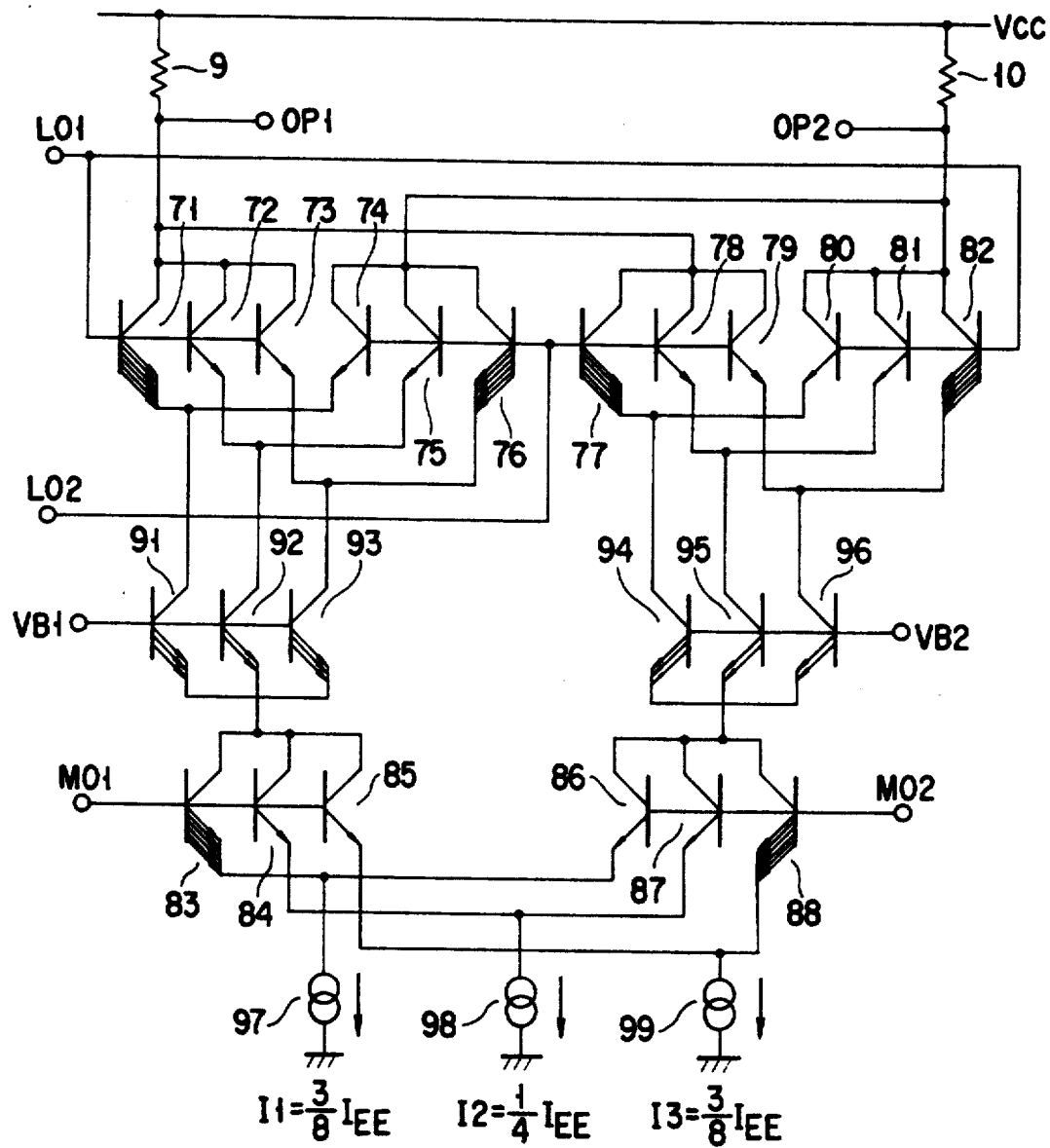
FIG. 11 is a circuit diagram showing a modification of the fourth embodiment.

FIG. 7 illustrates a multiplying circuit according to the fifth embodiment in which common-base transistors 105 to 110 having a small emitter area are inserted between the common emitter terminals of first and second differential amplifiers in FIG. 6 and weighting common-base transistors 91 to 96. This embodiment therefore has an effect of suppressing the reduction of the CMRR caused by transistors with a large emitter area and large parasitic capacitance, contained in the weighting common-base transistors 91-96, in addition to the advantage of the fourth embodiment in FIG. 6. In this embodiment the third differential amplifiers are constituted by transistors 101 to 104 and constant current sources 111 and 112, the emitter area ratio of the transistors 101 and 104 to the transistors 102 and 103 is determined to be 4:1, for example, and the current ratio of the constant current source 111 to the constant current source 112 is set as given in FIG. 7.

FIGS. 8 through 12 respectively illustrate multiplying circuits according to modifications of the first to fifth embodiments in which an input terminal pair LO1 and LO2, an input terminal pair LO3 and LO4, and an input terminal pair MO1 and MO2 are applied with input signals and the proper DC bias potentials while base terminals VB1, VB2, VB3 and VB4 of common-base transistors are applied with the proper DC bias potentials and are grounded in an AC manner. It is obvious that the above designs can accomplish the same operations as the previously described embodiments.

Although the first input signal and second input signal are both input to differential amplifiers in the above-described embodiments the first input signal may be input to the differential amplifiers while inputting the second input signal to a common-emitter amplifier. The following will describe such an embodiment.

FIG. 13 shows a multiplying circuit according to the sixth embodiment in which the first input signal is input to an input terminal pair LO1 and LO2 and the second input signal to another input terminal Rf. The first input signal input to the input terminal pair LO1 and LO2 is amplified by a differential amplifier comprising transistors 201 and 202. This differential amplifier has its output terminal pair (the collectors of the transistors 201 and 202) connected via a load circuit 203 to a voltage supply Vcc. In this example, the load circuit 203 is constituted by a current-mirror circuit comprising transistors 204 and 205, with the collector of the transistor 205 connected to an output terminal OP.

The second input signal input to the input terminal Rf is amplified by a common-emitter transistor 207, which has its base connected to the input terminal Rf and its emitter grounded.

A common emitter terminal of the transistors 201 and 202 in the differential amplifier is connected to the collector of the common-base transistor 206 whose emitter is connected to the collector of the common-emitter transistor 207. The common-base transistor 206 has its base terminal VB applied with the proper DC bias potential and grounded in an AC manner.

Since the common emitter terminal of the differential amplifier that amplifies the first input signal is coupled via the common-base transistor 206 to the collector of the common-emitter transistor 207 that amplifies the second input signal, the gain of the differential amplifier is proportional to the collector current of the transistor 207. An output signal proportional to the product of the first and second input signals is therefore acquired from the output terminal OP, which means that the circuit shown in FIG. 13 will function as a multiplying circuit.

If the multiplying circuit is used as the frequency converter or demodulator of a receiver that receives and demodulates a minute signal, it is necessary to reduce the thermal noise generated by the base parasitic resistance of the common-emitter transistor 207 in order to make the noise factor as small as possible. In this respect, a transistor a small base parasitic resistance or a relatively large emitter area is used for the common-emitter transistor 207. For the common-base transistor 206, a transistor with a small emitter area than that of the common-emitter transistor 207 is used. For instance, the emitter area ratio of the transistor 206 to the transistor 207 is determined to be 1:4.

Since the parasitic capacitance of the transistor 206 is smaller than that of the transistor 207, an impedance as viewed from the common emitter terminal of the differential amplifier toward the collector of the common-emitter transistor 207 is higher than the one in the conventional multiplying circuit which does not have the common-base transistor 206. It is therefore possible to suppress the CMRR from dropping due to the use of a transistor with a large emitter area for the common-emitter transistor 207 and reduce the leaking of the input signal from the input terminal pair LO1 and LO2 to the input terminal Rf.

FIG. 14 shows a multiplying circuit according to the seventh embodiment which includes three differential amplifiers for amplifying the first input signal and three common-base transistors. A first pair of differential transistors 301 and 304 constitute one of the differential amplifiers, a second pair of differential transistors 302 and 305 constitute another differential amplifier, and a third pair of differential transistors 303 and 306 constitute the last differential amplifier. These differential amplifiers have their output terminal pairs connected to a common load circuit 307 which is provided with an output terminal OP.

The common emitter terminals of the three differential amplifiers are connected to the collectors of the common-base transistors 308, 309 and 310, with the emitter of the transistor 308 connected to the collector of a common-emitter transistor 311. The common base terminal VB of the common-base transistors 308 to 310 is applied with the proper DC bias potential and grounded in an AC manner.

In this embodiment, the emitter area ratio of the transistors 301 and 306 to the transistors 302 to 305, all transistors constituting the differential amplifiers, is determined to be 4:1, and the emitter area of the transistor 308, to the transistor 309 and to the transistor 310 is set to 3:2:3, for example, a DC offset is given to the individual differential amplifiers, and a collector current proportional to the emitter area will flow through the common-base transistors. It is therefore possible to weight the distribution ratio of the currents flowing to the common emitter terminals of the individual differential amplifiers is weighted. This can provide linearity to the first input signal input to the input terminal pair LO1 and LO2. When this multiplying circuit is used as, for example, the frequency converter (mixer) of a receiver, with a local oscillator signal input to the input terminal pair LO1 and LO2 and a high frequency input signal input to the input terminal Rf, the harmonic of the local oscillator signal can be reduced. This will result in reduction of the amount of superimposition of the product of the interference wave or noise contained in the high frequency input signal and the local oscillator signal onto the desired output frequency.

FIG. 15 illustrates a multiplying circuit according to the eighth embodiment in which common-base transistors 312 to 314 (first common-base transistors) having a small emitter area are inserted between the common emitter terminals of the differential amplifiers in FIG. 14 and weighting common-base transistors 308 to 310 (second common-base transistors). The common base terminal VB1 of the transistors 308 to 310 and the common base terminal VB2 of the transistors 312 to 314 are applied with the proper DC bias potentials and are grounded in an AC manner.

This embodiment therefore has an effect of suppressing the dropping of the CMRR caused by transistors with a large emitter area and large parasitic capacitance, included in the weighting common-base transistors 308–310, by means of the additional common-base transistors 312 to 314, thus reducing the amount of the signal input to the input terminal pair LO1 and LO2 from leaking to the input terminal Rf, in addition to the advantage of the seventh embodiment in FIG. 14.

FIG. 16 shows a multiplying circuit according to the ninth embodiment, a preferable exemplary multiplying circuit to be used as an orthogonal demodulator in a receiver in a direct conversion system. The multiplying circuit comprises a combination of two of the multiplying circuits shown in FIG. 13 as a unit multiplying circuit. The two multiplying circuits share one common-emitter transistor.

In FIG. 16, the two unit multiplying circuits have pairs of input terminals LO1 and LO2, and LO3 and LO4, respectively. In the case of multiplying circuit as an orthogonal demodulator, an input signal at the input terminal pair LO1 and LO2 and that at the input terminal pair LO3 and LO4 are local oscillation signals whose phases are mutually shifted by 90°. A signal to be demodulated i.e. a modulated signal is input to another input terminal Rf.

The input signal at the input terminal pair LO1 and LO2 is amplified by a differential amplifier having transistors 401 and 402, and is sent from a load resistor 405 to an output terminal OP11. The input signal at the input terminal pair LO3 and LO4 is amplified by a differential amplifier having transistors 403 and 404, and is sent from a load resistor 406 to an output terminal OP12. The second input signal at the input terminal Rf is amplified by a common-emitter transistor 409. This transistor 409 has a base connected to the input terminal Rf and an emitter grounded.

The common emitter terminal of the transistors 401 and 402 and that of the transistors 403 and 404 are respectively connected to the collectors of common-base transistors 407 and 408. The emitters of the common-base transistors 407 and 408 are commonly connected to the collector of the common-emitter transistor 409. A proper DC bias potential is applied to a common base terminal VB of the common-base transistors 407 and 408, which is grounded in an AC manner.

The two differential amplifiers, which amplify the respective the local oscillation signals with their phase shifted by 90° each other, have their common emitter terminals connected via the respective common-base transistors 407 and 408 to the collector of the common-emitter transistor 409 which amplifies a modulated signal. A demodulation output with a phase shifted by 90°, i.e., an orthogonal demodulation output is yielded from the output terminals OP11 and OP12.

In this embodiment, the common-base transistors 407 and 408 reduce an influence on the parasitic capacitance of the common-emitter transistor 409 whose emitter area is enlarged to decrease a parasitic resistance, and distribute the output current (collector current) of the common-emitter transistor 409 to the two differential amplifiers.

An orthogonal demodulator is required to reduce a phase difference and a conversion gain difference. In a conventional orthogonal demodulator, a modulated signal to be demodulated is divided into two signals, which are in turn sent to two independent multiplying circuits where local oscillation signals with their phases shifted by 90° each other is supplied. In an orthogonal demodulator employing the multiplying circuit in FIG. 16, a modulated signal is input to the base of a common-emitter transistor shared by two multiplying circuits, which perform distribution on the signal and multiplication (orthogonal demodulation) on the distributed signals to a local oscillator signal. The orthogonal demodulator using the multiplying circuit in FIG. 16 therefore have fewer components through which a modulated signal passes than those of the conventional one. This can decrease factors causing a difference and reduce a phase difference and a conversion gain difference.

In the embodiment in FIG. 16, the multiplying circuit shown in FIG. 13 has been used as two basic unit multiplying circuits, but any of the multiplying circuit shown in FIGS. 14 to 17 may be used instead. Further, three or more unit multiplying circuits can be combined, sharing a common-emitter transistor.

The present invention can therefore provide a multiplying circuit which has less decrease in the CMRR at a high frequency and in signal leak from input terminals where two signals to be multiplied are input, and a broad linearity range with slight deformation.

Accordingly, using the multiplying circuit in a transmitter, for example, it is possible to acquire a transmission output having a low carrier leak and small deformation. The multiplying circuit when used in a receiver can make noise low, widen a dynamic range, and reduce the amount of undesired radiation due to the leakage of a local oscillator signal to an antenna system.

Additional advantages and modifications w 11 readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A multiplying circuit comprising:
    first and second differential amplifiers for receiving a first input signal and each having first and second output terminals and a common emitter terminal, the first output terminal of said first differential amplifier being connected to the second output terminal of said second differential amplifier, and the second output terminal of said first differential amplifier being connected to the first output terminal of said second differential amplifier;
    load means connected to said first and second output terminals of said first and second differential amplifiers;
    first and second common-base transistors having bases tied to a constant potential and collectors respectively connected to said common emitter terminals of said first and second differential amplifiers; and
    a plurality of third differential amplifiers for receiving a second input signal, each of said third differential amplifiers having a predetermined DC offset and third and fourth output terminals, and said emitters of said first and second common-base transistors being connected only to said third and fourth output terminals of said third differential amplifiers, respectively, whereby an output signal proportional to the product of the first and second input signals appears between the first and second output terminals of said first and second differential amplifiers.

2. A multiplying circuit according to claim 1, wherein each of said third differential amplifiers comprises a pair of transistors each having an emitter, and each of said third differential amplifiers has a predetermined emitter area ratio between the emitters of the transistors used therein to acquire said predetermined DC offset.

3. A multiplying circuit according to claim 1, wherein said first and second common-base transistors each have an emitter area smaller than the emitter area of one or more of the transistors used in each of said third differential amplifiers.

4. A multiplying circuit according to claim 1, wherein one of said third differential amplifiers is constituted by a pair of transistors having an emitter area ratio of 4:1 between emitters thereof, and another is constituted by a pair of transistors having an emitter area ratio of 1:4 between emitters thereof.

5. A multiplying circuit according to claim 1, wherein said third differential amplifiers are constituted by three pairs of transistors, a first one having an emitter area ratio of 8:1, a second one 1:1, and a third one 1:8.

6. A multiplying circuit according to claim 1, wherein said third differential amplifiers are constituted by four pairs of transistors, a first one having an emitter area ratio of 13:1, a second one 2:1, a third one 1:2, and a fourth one 1:13.

7. A multiplying circuit according to claim 1, wherein said bases of said first and second common-base transistors are tied to a ground potential as the constant potential.

8. A multiplying circuit comprising:
    a plurality of first differential amplifiers and a plurality of second differential amplifiers for receiving a first input signal, each of said first and second differential amplifiers having a predetermined DC offset and first and second output terminals and a common emitter terminal, the first output terminal of each of said first differential amplifiers being connected to the second output terminal of one of said second differential amplifiers, and the second output terminal of each of said first differential amplifiers being connected to the first output terminal of one of said second differential amplifiers;
    load means connected to said first and second output terminals of said first and second differential amplifiers;
    a plurality of first common-base transistors having bases tied to a constant potential, collectors each connected only to a respective one of said common emitter terminals of said first differential amplifiers, and emitters commonly connected;
    a plurality of second common-base transistors having bases also tied to a constant potential, collectors each connected only to a respective one of said common emitter terminals of said second differential amplifiers, and emitters commonly connected; and
    a plurality of third differential amplifiers for receiving a second input signal, each of said third differential amplifiers having a predetermined DC offset and third and fourth output terminals and said common emitter terminals of said first and second common-base transistors being connected only to the third and fourth output terminals of each of said third differential amplifiers, respectively, whereby an output signal proportional to the product of the first and second input signals appears between the first and second output terminals of said first and second differential amplifiers.

9. A multiplying circuit according to claim 8, wherein each of said first, second and third differential amplifiers comprises at least one pair of transistors each having an emitter, and wherein said first to third differential amplifiers each have a predetermined emitter area ratio between the emitters of said transistors thereof to acquire said predetermined DC offset, and each of said first and second common-base transistors has a smaller emitter area than the emitter area of said pair of transistors constituting each of said third differential amplifiers.

10. A multiplying circuit according to claim 8, wherein said bases of said first and second common-base transistors are tied to a ground potential as the constant potential.

11. A multiplying circuit comprising:
a plurality of first differential amplifiers and a plurality of second differential amplifiers for receiving a first input signal, each of said first and second differential amplifiers having a predetermined DC offset and first and second output terminals and a common emitter terminal, the first output terminal of each of said first differential amplifiers being connected to the second output terminal of one of said second differential amplifiers, and the second output terminal of each of said first differential amplifiers being connected to the first output terminal of one of said second differential amplifiers;
load means connected to said first and second output terminals of said first and second differential amplifiers;
a plurality of first common-base transistors having bases tied to a constant potential, collectors connected to said common emitter terminals of said first differential amplifiers, respectively, and emitters commonly connected to obtain a common emitter terminal, said emitters being set to have a predetermined emitter area ratio;
a plurality of second common-base transistors, having bases tied to a constant potential, collectors connected to said common emitter terminals of said second differential amplifiers, respectively, and emitters commonly connected to obtain a common emitter terminal, said emitters being set to have a predetermined emitter area ratio; and
a plurality of third differential amplifiers for receiving a second input signal, each of said third differential amplifiers having a pair of output terminals, said common emitter terminals of said first and second common-base transistors being connected only to respective output terminals of each of said third differential amplifiers, whereby an output signal proportional to the product of the first and second input signals appears between the first and second output terminals of said first and second differential amplifiers.

12. A multiplying circuit according to claim 11, wherein each of said first, second and third differential amplifiers comprises a pair of transistors having emitters, between which is set a predetermined emitter area ratio to acquire said respective predetermined DC offsets.

13. A multiplying circuit according to claim 11, wherein said bases of said first and second common-base transistors are tied to a ground potential as the constant potential.

14. A multiplying circuit comprising:
a plurality of first differential amplifiers and a plurality of second differential amplifiers for receiving a first input signal, each of said first and second differential amplifiers having a predetermined DC offset and first and second output terminals and a common emitter terminal, the first output terminal of each of said first differential amplifiers being connected to the second output terminal of one of said second differential amplifiers, and the second output terminal of each of said first differential amplifiers being connected to the first output terminal of one of said second differential amplifiers;
load means connected to said first and second output terminals of said first and second differential amplifiers;
a plurality of first common-base transistors having bases tied to a constant potential, collectors each connected only to a respective one of said common emitter terminals of said first differential amplifiers, and emitters;
a plurality of second common-base transistors having bases tied to a constant potential, collectors each connected only to a respective one of said common emitter terminals of said second differential amplifiers, and emitters;
a plurality of third common-base transistors having bases tied to a constant potential, collectors connected to emitters of said first common-base transistors, respectively, and emitters commonly connected to obtain a common emitter terminal, said emitters being set to have a predetermined emitter area ratio;
a plurality of fourth common-base transistors having bases tied to a constant potential, collectors connected to emitters of said second common-base transistors, respectively, and emitters commonly connected to obtain a common emitter terminal, said emitters being set to have the predetermined emitter area ratio; and
a plurality of third differential amplifiers for receiving a second input signal, each of said third differential amplifiers having a pair of output terminals, said common emitter terminals of said third and fourth common-base transistors being connected only to respective output terminals of each of said third differential amplifiers, whereby an output signal proportional to the product of the first and second input signals appears between the first and second output terminals of said first and second differential amplifiers.

15. A multiplying circuit according to claim 14, wherein each of said first and second differential amplifiers comprises a pair of transistors having emitters, between which is set a predetermined emitter area ratio to acquire said respective predetermined DC offsets.

16. A multiplying circuit according to claim 14, wherein said first and second common-base transistors each have an emitter area smaller than the emitter area of said third and fourth common-base transistors.

17. A multiplying circuit according to claim 14, wherein said bases of said first to fourth common-base transistors are tied to a ground potential as the constant potential.

18. A multiplying circuit comprising:
a differential amplifier for receiving a first input signal, having first and second output terminals and a common emitter terminal;
a load circuit connected to at least one of said first and second output terminals of said differential amplifier;
a common-emitter transistor having a base supplied with a second input signal; and
a common-base transistor having a base tied to a constant potential, a collector connected only to said common emitter terminal of said differential amplifier, and an emitter connected only to a collector of said common-emitter transistor and having a smaller emitter area than said common-emitter transistor whereby an output signal proportional to the product of the first and second input signals appears at at least one of the first and second output terminals of said differential amplifier.

19. A multiplying circuit comprising:
a plurality of differential amplifiers for receiving a first input signal, each of said differential amplifiers having a predetermined DC offset and first and second output terminals and a common emitter terminal,
a load circuit connected to at least one of said first and second output terminals of each of said differential amplifiers;
a common-emitter transistor having a base supplied with a second input signal and
a plurality of common-base transistors having bases tied to a constant potential, collectors each connected only to a respective one of said common emitter terminals of said multiple differential amplifiers, respectively, and emitters connected only to a collector of said common-emitter transistor, said emitters of said common-base transistors being set to have a predetermined emitter area ratio.

20. A multiplying circuit comprising:
a plurality of differential amplifiers for receiving a first input signal, each of said differential amplifiers having a predetermined DC offset and first and second output terminals and a common emitter terminal,
a load circuit connected to at least one output terminal of said first and second output terminals of each of said differential amplifiers;
a common-emitter transistor having a base supplied with a second input signal;
a plurality of first common-base transistors having bases tied to a constant potential, and emitters connected only to a collector of said common-emitter transistor, the emitters of said first common-base transistors being set to have a predetermined emitter area ratio; and
a plurality of second common-base transistors having bases tied to a constant potential different from the constant potential applied to said first common-base transistors, collectors respectively connected to said common emitter terminals of said multiple differential amplifiers and emitters respectively connected to collectors of said first common-emitter transistors and having emitter areas equal to or smaller than a minimum emitter area of one of said first common-base transistors.

21. A multiplying circuit apparatus comprising:
a plurality of multiplying circuits to which a plurality of first input signals are supplied respectively; and
a common-emitter transistor commonly connected to said plurality of multiplying circuits and having a base to which a second input signal is supplied,
each of said plurality of multiplying circuits comprising:
a differential amplifier for receiving one of said first input signals, having first and second output terminals and a common emitter terminal;
load means connected to said first and second output terminals; and
a common-base transistor having a base tied to a constant potential and a collector connected only to said common emitter terminal of said differential amplifier,
whereby an output signal proportional to the product of the first and second input signals is obtained from said multiplying circuits.

* * * * *

UNITED STATES PATENT AND TRADEMARK OFFICE
CERTIFICATE OF CORRECTION

PATENT NO. : 5,311,086

DATED : May 10, 1994

INVENTOR(S) : Takafumi Yamaji, et. al

It is certified that error appears in the above-identified patent and that said Letters Patent is hereby corrected as shown below:

On the Title page, item [76], inventors: Chikau Yakahashi should be --Chikau Takahashi--.

Signed and Sealed this

Sixteenth Day of August, 1994

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.  : 5,311,086
DATED       : May 10, 1994
INVENTOR(S) : Takafumi Yamaji, et al It is certified that error appears in the above-indentified patent and that said Letters Patent is hereby corrected as shown below:

On the Title page, item [75], inventors:  Chikau Yakahashi should be --Chikau Takahashi--.

This certificate supersedes Certificate of Correction issued August 16, 1994.

Signed and Sealed this

Eleventh Day of October, 1994

Attest:

BRUCE LEHMAN

Attesting Officer

Commissioner of Patents and Trademarks